(12) United States Patent
Rigney et al.

(10) Patent No.: US 6,620,465 B2
(45) Date of Patent: *Sep. 16, 2003

(54) PHYSICAL PROPERTIES OF THERMAL BARRIER COATINGS USING ELECTRON BEAM-PHYSICAL VAPOR DEPOSITION

(75) Inventors: Joseph D. Rigney, Milford, OH (US); David J. Wortman, Schenectady, NY (US)

(73) Assignee: General Electric Company, Schenectady, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 17 days.

(21) Appl. No.: 09/296,632

(22) Filed: Apr. 23, 1999

(65) Prior Publication Data

US 2003/0140855 A1 Jul. 31, 2003

(51) Int. Cl.$^7$ .................. C23C 14/30; C23C 14/08; C23C 16/448
(52) U.S. Cl. ................ 427/567; 427/566; 427/585; 427/596; 427/255.32; 427/255.36; 118/723 EB; 428/623; 428/629; 428/633
(58) Field of Search ............... 219/121.15, 121.29; 118/726, 723 EB, 719, 723 VE, 728; 204/298.01; 427/566, 595, 596, 597, 248.1, 561, 567, 585, 255.32, 255.36, 256; 428/623, 628, 629, 633

(56) References Cited

U.S. PATENT DOCUMENTS

| | | | |
|---|---|---|---|
| 5,346,600 A | * 9/1994 | Nieh et al. | 204/192.3 |
| 5,378,500 A | * 1/1995 | Ward-Close et al. | 427/250 |
| 5,418,003 A | 5/1995 | Bruce et al. | 427/126.2 |
| 5,556,472 A | * 9/1996 | Nakamura et al. | 118/719 |
| 5,660,930 A | * 8/1997 | Bertero et al. | 428/332 |
| 5,698,273 A | 12/1997 | Azad et al. | 427/566 |
| 5,736,263 A | * 4/1998 | Yoshida et al. | 428/611 |
| 5,753,319 A | * 5/1998 | Knapp et al. | 427/529 |
| 5,873,985 A | * 2/1999 | Tokunaga et al. | 204/192.34 |
| 5,876,684 A | * 3/1999 | Withers et al. | 423/445 B |
| 5,876,860 A | * 3/1999 | Marijnissen et al. | 428/623 |
| 5,998,003 A | * 12/1999 | Courtright et al. | 428/216 |
| 6,010,751 A | * 1/2000 | Shaw et al. | 427/255.7 |
| 6,054,184 A | * 4/2000 | Bruce et al. | 427/255.7 |
| 6,057,047 A | * 5/2000 | Maloney | 428/623 |

* cited by examiner

*Primary Examiner*—Shrive P. Beck
*Assistant Examiner*—Wesley Markham
(74) *Attorney, Agent, or Firm*—Carmen Santa Maria; Kurt L. Ehresman; McNees Wallace & Nurick LLC

(57) ABSTRACT

An improved method for applying a ceramic material, such as a thermal barrier coating to an article. A method for applying a ceramic material as a coating to a substrate article in which the thermal conductivity of the ceramic material is reduced or lowered is provided. The thermal conductivity of a coating applied by a physical vapor deposition (PVD) method is dependent upon its distance from the source(s) of material used for the coating. The thermal conductivity of the applied coating is altered by adjusting the position of the article undergoing the PVD process by increasing the distances of the article or workpiece from the ingot or source of ceramic material to provide a coating of lower thermal conductivity. In accordance with the present invention, the article to be coated is positioned at a distance required to achieve at least a 10% reduction in the thermal conductivity of the applied coating.

13 Claims, 3 Drawing Sheets

PHYSICAL PROPERTIES OF THERMAL BARRIER COATINGS USING ELECTRON BEAM-PHYSICAL VAPOR DEPOSITION

BACKGROUND OF THE INVENTION

1. Field of the Invention

This invention is directed to a method and apparatus for forming thermal barrier coatings having improved performance characteristics for high temperature applications, and specifically to an electron beam physical vapor deposition process for applying thermal barrier coatings having lower thermal conductivity.

2. Discussion of Prior Art

Physical vapor deposition methods are used to apply coatings to various workpieces. These coatings, typically ceramic material, provide the workpiece, such as an airfoil when placed in the hot gas flow path insulation from hot combustion gases such as are found in a turbine engine. It is important for the coating to have low thermal conductivity and spallation resistance in order to provide the desired benefits. The thermal conductivity of the coating critically controls the thickness requirements needed to achieve the required temperature benefit for a particular design. However, the coating on the airfoil adds mass that subsequently affects stresses in the airfoil and the life of the underlying substrate. It is thus desirable to minimize the density and thickness of the coating while maintaining the required thermal characteristics of the coating.

Methods for depositing these ceramic coatings entail placing a source of material in a vacuum chamber. The workpiece is placed in proximity to the material source within the vacuum chamber, typically over the material source. A high energy source, such as an electron gun, emits a high energy beam directed at the material source, which melts and vaporizes material from the source and disperses vapors, some of which are deposited onto the workpiece to form a coating.

One such method is set forth in U.S. Pat. No. 5,418,003 ('003) to Bruce et al. and assigned to the assignee of the present invention. The '003 patent is directed to a method of improving the coating resulting from an electron beam physical vapor deposition process by eliminating gases present in the ingot, the material source as a preparatory step for the deposition process.

Another method is set forth in U.S. Pat. No. 5,698,273 ('273) to Azad et al. and also assigned to the assignee of the present invention. In the '273 patent, a plurality of electron beams are directed at the source of the material, the ingot, to improve the vaporization rate of material from the melt pool. This method discloses placing the workpiece in a vacuum chamber above a crucible containing the ingot. A primary electron beam scans the surface of the ingot to develop a melt pool on the surface of the ingot and vaporize ingot material. A secondary electron beam is directed at the melt pool to increase the vaporization rate of material from the melt pool.

The traditional method of applying a coating by this method has been to position a workpiece or a plurality of workpieces directly over the ingot or material source(s), applying energy until the desired coating thickness was achieved. In systems with a plurality of ingot sources, the spacing of the ingots and the height of the specimens above the plane containing the ingots are adjusted to maximize the number of parts that can be coated in one cycle with a uniform layer of coating material. The coatings produced in this manner have had a relatively uniform thickness, uniform thermal conductivity and have performed substantially identically in service. This prior art practice has positioned the articles undergoing a physical vapor deposition coating operation at locations over the ceramic ingot having relatively fixed distances. Coatings applied to articles within this narrow range of locations have been relatively uniform with respect to both thickness and thermal conductivity. This uniformity and reproducibility is a desirable feature for predicting subsequent performance of the coated articles. Typically, these physical vapor deposition methods have been used to apply consistent thermal barrier coatings that have predictable behavior in service, and improvements in the thermal performance of the coatings have generally been accomplished by increasing the thickness of the coating.

SUMMARY OF THE INVENTION

An improved method for applying a ceramic material, such as a thermal barrier coating to an article such as a turbine airfoil is provided by the present invention. The effectiveness of a thermal barrier coating can be improved by reducing its thermal conductivity. The present invention provides a method for applying a ceramic material as a coating to a substrate article in which the thermal conductivity of the ceramic material is reduced or lowered. The process utilizes typical physical vapor deposition apparatus that includes a vacuum chamber, a vacuum pump for evacuating the vacuum chamber, two or more sources of ceramic material that is to be applied as a coating on the article and a high energy source to provide sufficient energy to melt and vaporize the material that forms the coating. The coating with the improved or lowered thermal conductivity is formed by placing the article to be coated in a vacuum chamber at a preselected distance away from the source of material that forms the coating. The sources of material are typically two or more ceramic ingots.

It has been discovered that the thermal conductivity of a coating applied by a physical vapor deposition (PVD) method is dependent upon its distance from the source(s) of material used for the coating. The thermal conductivity of the applied coating can be altered by adjusting the position of the article undergoing the PVD process with respect to the ingot(s). Increasing the distances of the article or workpiece from the ingot or source of ceramic provides a coating of lower thermal conductivity. In accordance with the present invention, the article to be coated is positioned at a distance required to achieve at least a 10% reduction in the thermal conductivity of the applied coating.

An advantage of the present invention is that a coated article can be produced having a lower conductivity and, hence capable of withstanding higher temperature gradients with the same applied thickness.

Another advantage of the present invention is that an article having a thinner coating but capable of withstanding the same temperature gradients as articles coated by prior practices can be produced using the teachings of the present invention.

Still another advantage of the present invention is that a series of articles having the same thickness, but with a variety of temperature capabilities can be produced simultaneously by adjusting the positions of the articles with respect to the source.

The manufacturing process of the present invention can be modified by separating the ingots in a system including at least two ingots such that the thickness variation can be tailored to a thermal conductivity variation to obtain the desired temperature gradient. Such a processing change provides the advantage of allowing an increase in the number of parts having a predictable thermal gradient value coated at one time.

An advantage of the present invention is that existing PVD processing equipment can be utilized to perform the processes of the present invention with minor modifications to the equipment in most cases.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
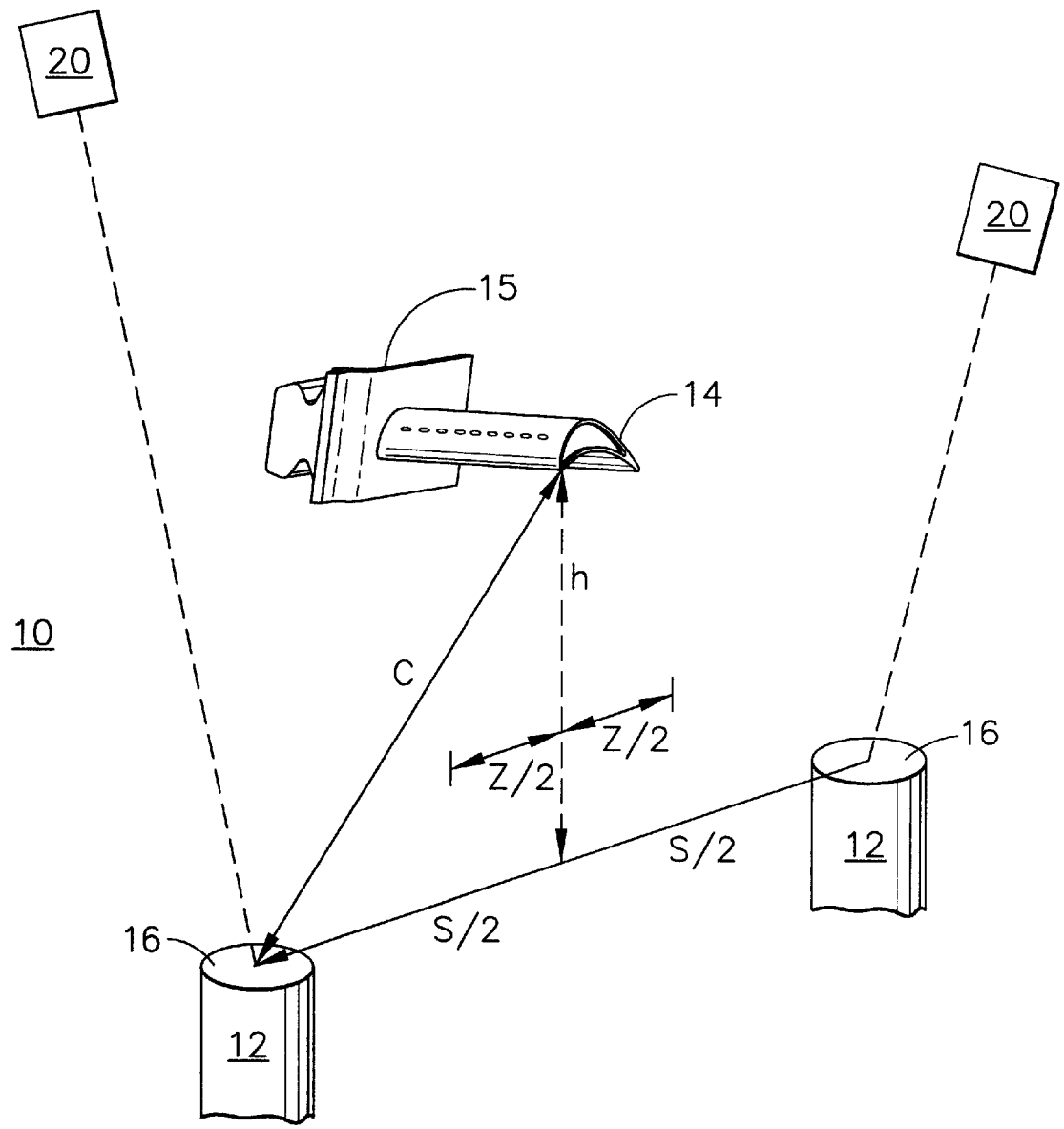
FIG. 1 is a schematic of the present invention showing a system having two sources of coating materials with a fixtured airfoil in a coating position between the coating material sources at a critical distance from the coating sources.

The present invention is best described with reference to FIG. 1, which is a schematic of an otherwise typical PVD coating apparatus. FIG. 1 will be described in terms of an electron beam coating apparatus and procedure. An interior volume 10 of a vacuum chamber is shown. A pair of ingots 12, which are the source of ceramic material used for the coating process, are positioned within interior volume 10 of the vacuum chamber. In the preferred embodiment of the present invention, the ceramic ingots are zirconia stabilized with yttria, for example zirconia stabilized with about 7%-yttria by weight referred to as 7YSZ. Suspended within interior volume 10 of the vacuum chamber and positioned at a height "h" and a minimum distance "c" from ingots is a workpiece. In the preferred embodiment, this workpiece is airfoil 14. It is shown in FIG. 1 as suspended in a fixture 15 between the ingots, but may be positioned between the ingots using any suitable fixture positioned by any acceptable means within interior volume 10 of the vacuum chamber. The fixture may hold a plurality of workpieces. Energy sources provide energy to melt material on the surface 16 of ingot 12. In FIG. 1, two electron guns 20 are shown, each directing an electron beam onto surface 16 of ingot 12. The guns are located within vacuum chamber 10. However, other sources of energy such as lasers may be used, and these may be located outside of vacuum chamber 10 and may project the energy into the vacuum chamber through a window. Also, additional energy sources such as set forth in U.S. Pat. No. 5,698,273 ('273) to Azad et al. may be used to improve the vaporization of the ceramic material from ingot 12.

As shown in FIG. 1, airfoils 14 are positioned a minimum distance "c" from ingots 12. It has been discovered that articles positioned at this minimum distance "c" have a coating that is less dense than articles coated by being positioned over or in very close proximity to the ingots, as has been the prior art practice. The density of the coating is reduced through an increase in porosity with increasing distance from the coating source.

Density is directly related to thermal conductivity as set forth in the relationship $$k = \alpha * \rho * C_p \quad (1)$$

where k is thermal conductivity;

α is thermal diffusivity;

ρ is density; and $C_p$ is specific heat.

Thus, it can be seen that the thermal conductivity k of an applied coating is directly proportional to the density of the coating. Of course, the thermal conductivity is also affected by the thermal diffusivity α, which is affected by microstructure and porosity distribution at various positions, which further reflects the importance of the relationship between density and thermal conductivity.

Furthermore, at steady state conditions, $$j = k(\Delta T/t) \quad (2)$$

where j is heat flux, which is heat flow through a unit area per unit of time;

k is thermal conductivity;

ΔT is the temperature gradient across the coating; and t is the coating thickness.

For established engine operating conditions, at steady state, heat flux is constant, so that for two coatings, designated as 1 and 2 in the equations below, comprised of the same material but having different thermal conductivities, $$j_1 = j_2 \quad (3)$$

so that $$k_1(\Delta T_1/t_1) = k_2(\Delta T_2/t_2) \quad (4).$$

For the situation in which the intended temperature gradient ΔT is the same, that is $\Delta T_1 = \Delta T_2$, through the two coatings designated above, the following is true:

$$k_1/t_1 = k_2/t_2 \quad (5).$$

It can be seen from eq. 5 that at steady-state, if the thermal conductivity k of the coating is modified to keep the temperature gradient ΔT the same across the coating, the thickness of the coating must be correspondingly modified. Equation 1 indicates that the density ρ is proportional to thermal conductivity k. Then from eq. 4 and 5, by making the appropriate substitutions, the thickness of a coating may be increased or decreased as the density of the coating is increased or decreased respectively.

The standard practice has assumed that the most efficient method for coating articles is to place the airfoils over the ingot as closely as possible and to coat the airfoils to a uniform thickness, maintaining the thickness variation from airfoil to airfoil to within specification limits set forth by design parameters. This practice has been based on the belief that the densities of coatings on parts within the chamber are relatively constant, and proximity to the coating source permits the coating to be deposited more quickly. The standard practice assumed that there was no variation in coating parameters within the vacuum chamber and hence the closer that the workpiece was to the source of coating material, the faster the coating process could be accomplished. An article located a greater distance from the source was assumed to achieve the same thickness and same thermal conductivity, but in a longer time. The result has been self-fulfilling, in that the airfoils or workpieces have been placed in close proximity to the coating source where the coating parameters have been relatively constant, while remote locations have not been utilized because of perceived inefficiencies in time required to achieve coatings of comparable thicknesses as distance from the source of coating materials increased.

Figure 2:
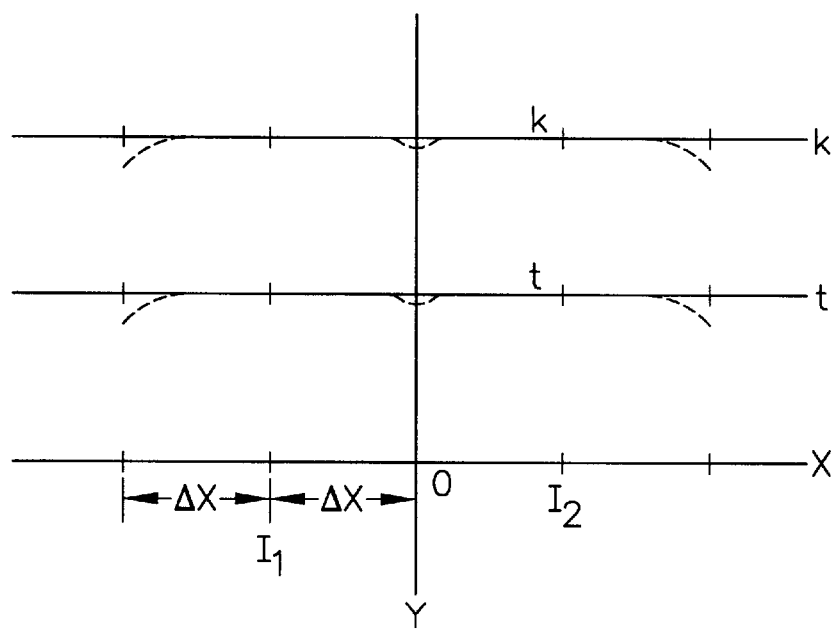
FIG. 2 is a representation of resulting thicknesses and thermal conductivities of coatings with distance from coating source as applied by prior art electron beam physical vapor deposition (EB-PVD) processes.

FIG. 2 shows the relationship of the thickness of the coating and the thermal conductivity based on the distance that the articles are positioned from a pair of ingot sources, I1 and I2, as set forth in the present invention. The prior art has placed the workpieces within the vacuum chamber at distances identified on the horizontal axis by Δx from the ingot source, I1 or I2. This preselected distance will vary from one type of coater to another, but is always within a region in which there is a substantially constant thermal conductivity k. Coating has been applied to a thickness of t. The prior art practice has assumed that applied coating thickness t anywhere in the vacuum chamber is substantially the same, workpieces positioned at greater distances from the ingot source, I1 or I2, requiring correspondingly longer times to achieve thickness t. Implicit with this assumption was the assumption that the thermal conductivity k remained constant for the deposited coating, regardless of where the workpiece is located in the vacuum chamber. Since the time to coat a workpiece to a predetermined thickness t increases with increasing distance, the goal was to position the workpiece as close as possible to the ingot source, I1 or I2, depicted as Δx so as to minimize cycle time. As noted, this distance Δx varies from one type of coating equipment to another.

As has been discovered by this invention while the coating thickness does vary with increasing distance from the material source as previously believed and as shown by the dotted lines in FIG. 2, the thermal conductivity of the coating is not constant, but varies with distance from the coating source. The amount of time to achieve the desired coating thickness t has controlled the maximum distance Δx from the ingot source, I1 or I2, which in prior art practice has been the narrow region Δx around each ingot source, I1 or I2, so that during the given time period during which the coating process occurs, the variation in thickness and hence variation in thermal conductivity, has been negligible in the coated parts. While this prior art process does provide an acceptable final product with a very controllable and repeatable process, it did not appreciate the discovery of the present invention.

In the present invention with minor modifications, the existing coating equipment can take advantage of the reduced thermal conductivities at increased distances from the ingot source. By applying a coating with a lower thermal conductivity, the coating thickness can be reduced so that a thinner, less dense coating can be applied to an airfoil while maintaining the same temperature gradient capabilities.

Figure 3:
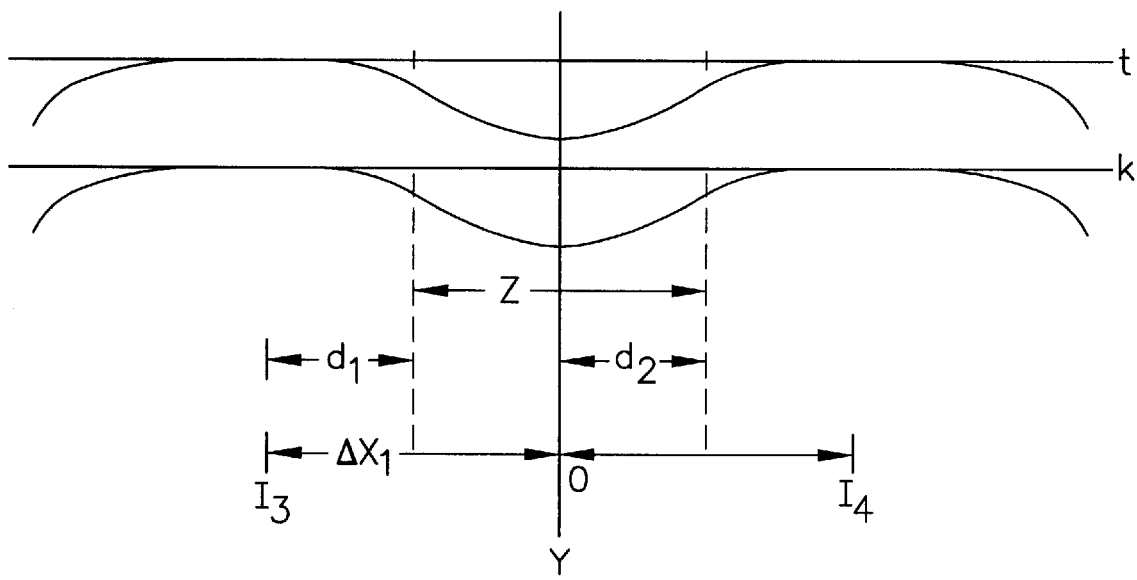
FIG. 3 is a representation of thermal conductivities with distance for coating source as applied by the improved EB-PVD processes of the present invention.

FIG. 3 indicates the relationship of the distance from the ingot sources and the thermal conductivity of the coating. FIG. 3 illustrates a system having two ingots, I3 and I4, as sources of coating material; however the relationship between thermal conductivity and distance from the ingot is true regardless of the number of ingots used for coating. As the distance $\Delta X_1$ from the workpiece to the source of coating material or ingot increases, the thermal conductivity k decreases. At a certain critical distance from the ingot sources, defined as "d," the thermal conductivity decreases by a preselected amount which will vary from system to system. In FIG. 3, $d_1$ is the critical distance "d" associated with ingot $I_3$ and $d_2$ is the critical distance "d" associated with ingot $I_4$. This invention has found this preselected decrease in thermal conductivity is at least about 10% at distance "d" from the ingots as compared to workpieces coated directly over the ingots, but is likely to be greater when the system is optimized. Thermal conductivity may continue to decrease with increasing distance $\Delta X_1$ until a trough is reached. Although this is shown graphically in two dimensions, a coating zone having a critical distance "d" at which the thermal conductivity decreases by a preselected amount from each source can be established from each ingot. Because the thermal conductivity of coated parts is related to the distance $\Delta X_1$ from the ingot source, as is the thickness of coating, the present invention can be utilized to achieve a number of heretofore unrecognized processing capabilities while maintaining a constant thermal gradient across a coated workpiece.

The processing of the present invention may be used to achieve a reduction in coating thickness for an airfoil without affecting the temperature gradient capability, ΔT, of the airfoil by positioning the workpiece at a predetermined distance from the ingot source in order to achieve a reduction in the thermal conductivity of the applied coating. Referring to FIG. 1, by positioning airfoils 14 at a predetermined minimum critical distance "c" from each of a pair of ingot sources 12, the thermal conductivity of the coatings is reduced. This can most easily be accomplished by increasing the distance "s" between the ingot sources. Because this distance will vary from one type of processing equipment to another, the critical distance "d" is defined a the distance from the ingot source to the workpiece required to reduce the thermal conductivity of the applied coating by at least about 10%. In FIG. 1, "s" is the distance between the ingot sources, "z" is the zone in which the thermal conductivity of the coating is reduced by at least 10% as compared to a part positioned substantially over ingot 12, and "h" is the height of the airfoils above the ingot sources. Then "c" is defined by the relationship:

$$c=[(s/2-z/2)^2+h^2]^{1/2} \tag{6}$$

"c" establishes a minimum dimension from ingot 12 to coat parts in order to achieve a preselected reduction in thermal conductivity k in a two ingot system. For the two ingot system shown in FIG. 1 in two dimensions, this translates into a zone around a central plane bisecting the distance between the ingot sources having width "z". This zone can assume any shape so long as the workpieces achieve the preselected reduction in thermal conductivity. Optimization of the system may provide thermal conductivity decreases of up to 20% or greater.

The discovery that the thermal conductivity k varies with distance from the ingot source, the thermal conductivity decreasing with increasing distance from the ingot source, also provides other options not previously appreciated. It is expected that within limits, the relationship between coating thermal conductivity, coating thickness and distance from the coating source is such that the ratio of thermal conductivity to coating thickness is constant. The limit of decreased thermal conductivity is dependent on the relative distance from the ingot. However, it is believed that the maximum reduction in thermal conductivity k is about 40% and any further increases in distance between the ingot source and the deposition surface will provide no further improvements, and may be detrimental without further alterations to the process.

If two parts located at a distance $z_1$ and $z_1+\Delta z$ from a pair of coating sources are coated for a unit of time, the part located at distance $z_1$ receives a coating of thickness $t_1$ having a thermal conductivity of $k_1$, while the part located at a distance $z_1+\Delta z$ receives a coating of thickness $t_2$ having a thermal conductivity of $k_2$. While the part located at position $z_1$ receives a coating of thickness $t_1$ which is thicker than coating $t_2$ because of proximity to the coating sources, the thermal conductivity $k_1$ is greater than the thermal conductivity $k_2$. For the two parts, the value of k/t is essentially a constant, as is expected from eq. 5. The practical effect of this invention is that within the limits discussed above, a plurality of parts positioned at different distances from coating sources may be coated simultaneously within a coating apparatus and achieve the same thermal gradient. Even though the coating thickness will vary among parts located at varying distances from the coating source, the parts will be capable of withstanding the same temperature gradient. This translates into significantly higher productivity, as the loading of the articles into the coater can be increased since the location of the parts is no longer restricted to the region proximate to the ingot sources. In fact, the ingot sources can be moved further apart by a preselected distance so that a maximum loading of the coating apparatus is achieved. Based on the maximum 40% thermal conductivity reduction limit expected, the limit that the two ingot sources can be moved apart is that preselected distance at which an article located over the center of the coat zone receives 60% of the coating heretofore deposited directly over an article positioned over either source. The distance between the ingot sources to get 30% contribution from each ingot would depend on the height of the parts above the plane of the ingot pools and their diameters.

Unlike the prior art in which "c" approached "h" as "s" becomes very small and coating thickness t was assumed to be uniform, the present invention recognizes that the coating thickness t may be reduced by an amount equivalent to the reduction in thermal conductivity achieved when the airfoil is moved away from the ingot source. This is critical not only from the standpoint that a larger volume of the coating equipment can be utilized to coat airfoils, but that airfoils capable of withstanding the same thermal gradients, but having thinner coatings because of lower densities and lower thermal conductivities can be produced. The thinner coatings and lower densities produce lower weights in the airfoils, so that the airfoils and the turbine disks to which they are attached will experience lower stresses in service. These stresses are well-known in parts rotating at high speeds and high temperatures. These lower stresses translate into longer life since fatigue failures are directly related to stresses induced in a part over its operating life. In the prior art processing, using electron beam PVD equipment, it has been common practice to fixture the parts to be coated at a height of about 20 cm. or greater almost directly over the ingot so that the distance from an axis of the ingot is insignificant. By contrast, the present invention envisions placing the airfoils at a distance "c" of at least about 25 cm. from the closest ingot. The combination of "h" over the ingot and "s" may vary, provided however that "s/2" is at least about 10 cm. Subject to the qualification that the value must be determined on a case-by-case analysis that is system dependent, it is believed that the distance "c" between the airfoils and the closest ingot can be extended to about 100 cm. while producing coating that is within the limits established by this invention. These system dependent variables include ingot size, feed rate, power input, partial pressure of vacuum and number of ingots.

Processing using existing equipment can be modified so that workpieces, having different thermal conductivity requirements can be coated at the same time. Referring to FIG. 3, the thermal conductivity varies with distance from the ingot. Thus, by placing airfoils which will experience known but different thermal gradient requirements at different distances from the ingot, a plurality of airfoils can be coated in the same coater, each having a different thermal conductivity, and for a given coating thickness, each capable of withstanding different thermal gradients. Thus, airfoils that require the greatest thermal gradients should be provided with the lowest thermal conductivities. These airfoils are placed in a zone bisecting the distances between the ingot sources, while airfoils requiring intermediate conductivity values are placed closer to the ingot sources, and airfoils located directly or close to directly over the ingot sources will have coatings with the highest conductivity and will have the lowest thermal gradient potential for a given thickness. In this manner, the maximum volume of the coating equipment can be utilized so that more parts can be coated in the coater.

Figure 4:
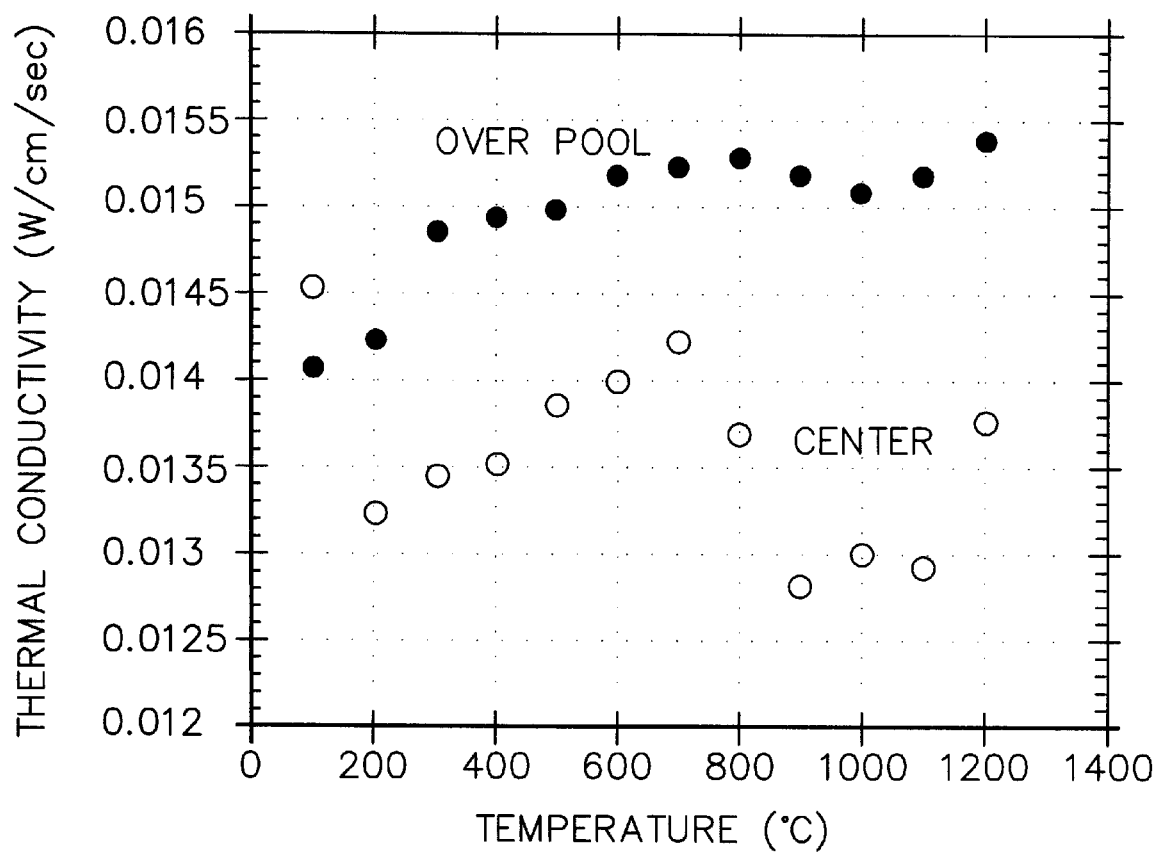
FIG. 4 is a graph of thermal conductivities at given temperatures for coatings produced on workpieces positioned at different locations in the chamber.

In FIG. 4, the thermal conductivity of a coating produced on a workpiece located over the pool of material is graphed for selected temperatures. In addition, the thermal conductivity of a coating produced on a workpiece located in the center of pools of material is also graphed on FIG. 4 for the same selected temperatures. As can be seen in FIG. 4 the thermal conductivity of the coating on the workpiece located in the center of the pools of material is lower than the thermal conductivity of the coating of the workpiece located above the pool for the majority of selected temperatures.

EXAMPLE 1

Three panels having dimensions of 25×100×1.5 mm$^3$ were placed in an EB-PVD coater in each run.

The EB-PVD coater utilized two ingots of 7YSZ as sources of coating materials. Two samples were placed immediately above the ingots, one above each ingot, and one sample was placed midway between the ingots. Each sample was made of HS-188. Before applying the thermal barrier coating, each sample received the standard preparation techniques in order to produce a clean surface with the roughness of approximately 60 $\mu$in $R_A$.

Density measurements were then made on each of the samples coated in the EB-PVD coater. The measured densities for the coated parts were compared to the theoretical maximum density for 7YSZ containing 1 wt % $HfO_2$ is 6.0434 g/cm$^3$. The coating process was repeated six times. The average densities of the samples directly over the ingots were compared to the density of the samples over the center position. The results are provided in Table 1. The density of the samples positioned directly over the ingots are consistently higher than the density of the samples located midway between the ingots. The differences in density between the actual value of samples at positions over the ingots as compared to samples at the center position and the theoretical density of 7YSZ are shown in column 4 of Table 1.

TABLE 1

Density results from 6 runs made in a single campaign. The average difference in TBC density is 2.87% theoretical.*

| Trial Number | Density (g/cm$^3$) | | Difference In Porosity Levels (%) | % Change in Density |
|---|---|---|---|---|
| | Over Pool | Center | | |
| 1 | 4.64 | 4.35 | 4.82 | 6.3 |
| 2 | 4.71 | 4.53 | 2.86 | 8.7 |
| 3 | 4.67 | 4.60 | 1.12 | 1.5 |

TABLE 1-continued

Density results from 6 runs made in a single campaign. The average difference in TBC density is 2.87% theoretical.*

| Trial Number | Density (g/cm³) | | Difference In Porosity Levels (%) | % Change in Density |
|---|---|---|---|---|
| | Over Pool | Center | | |
| 4 | 4.89 | 4.76 | 2.13 | 2.6 |
| 5 | 4.99 | 4.71 | 4.56 | 5.5 |
| 6 | 5.05 | 4.95 | 1.71 | 2.0 |

*Theoretical maximum density for 7YSZ with 1 wt. % HfO$_2$ impurity is 6.0434 g/cm³. Values reported are an average of 10 or more individual measurements.

EXAMPLE 2

Two samples of Rene N5 having dimensions 12.7×12.7×0.38 mm³ were separately prepared and coated in an EB-PVD coater having two ingot sources of 7YSZ. The first panel was located over one of the ingots or sources of coating material. The second sample was positioned midway between the ingots in a manner such as shown in FIG. 1. Each of the samples, after coating, was tested for thermal conductivity. The thermal conductivity of the sample positioned in the center position had a 10% lower thermal conductivity than the samples positioned directly over the sources of coating material. The density difference between the coatings was 2.42% theoretical, that is to say the density difference varied by 2.42% based on the theoretical density of 7YSZ containing 1 wt. % HfO$_2$ impurity at 6.0434 g/cm³. The thicknesses were about the same in the two samples and the sample having lower density had a greater ΔT capability by about 10%. The test results are shown in FIG. 4. This small difference in coating density and deposition structure resulted in a 10% difference in conductivity between parts coated directly over the sources of coating material and parts positioned between the sources of the coating material.

Although the present invention has been described in connection with specific examples and embodiments, those skilled in the art will recognize that the present invention is capable of other variations and modifications within its scope. These examples and embodiments are intended as typical of, rather than in any way limiting on, the scope of the present invention as presented in the appended claims.

What is claimed is:

1. A method for applying thermal barrier coatings of variable thermal conductivity to a plurality of turbine airfoils using a physical vapor deposition apparatus that includes an evacuated vacuum chamber containing a pair of ingots and a pair of high energy sources to melt and vaporize the ingot material to disperse vapors therefrom, comprising the steps of:

evacuating the vacuum chamber;

placing a plurality of airfoils in the vacuum chamber for a preselected time over the ingots and at preseleted distances from the ingots, the distances selected so that the thermal conductivity of applied coating decreases with increasing distance from the ingots;

directing beams from the high energy sources onto the ingots so that melt pools are formed on top of the ingots from which the ingot material is vaporized, at least a portion of the vapors from the ingots being deposited on each airfoil to form a coating;

maintaining the vaporization of the ingot material until a predetermined thickness of coating is established on the surface of the airfoils, the thermal conductivity of the applied coating on each airfoil decreasing with increasing distance from the ingot and the thickness of the coating decreasing with increasing distance from the ingot so that the ratio of thermal conductivity to thickness of the coating on the airfoils is substantially constant.

2. The method of claim 1 wherein the physical vapor deposition apparatus is an electron beam-physical vapor deposition apparatus and the high energy sources are electron guns positioned within the vacuum chamber.

3. The method of claim 1 wherein the ingots are ytrria-stabilized zirconia.

4. The method of claim 3 wherein the ytrria-stabilized zirconia is 7YSZ.

5. The method of claim 4 wherein the reduction in coating density between an airfoil positioned at the preselected distance from the ingot and an airfoil positioned substantially over the ingot is at least about 2% based on the maximum theoretical density of 7YSZ.

6. A method for applying a coating having a reduced thermal conductivity to a workpiece using a physical vapor deposition apparatus including a vacuum chamber comprising a plurality of sources of ceramic material and at least one high energy source to melt and vaporize the ceramic material of the plurality of sources of ceramic material and disperse vapors therefrom as a coating on the workpiece, the method comprising the steps of:

evacuating the vacuum chamber;

placing the workpiece in the vacuum chamber at a preselected distance from the plurality of sources of ceramic material, the distance selected so that the thermal conductivity of applied coating is reduced by at least 10% from a coating applied at a position substantially over a source of ceramic material;

directing a beam from the at least one high energy source onto the plurality of sources of ceramic material so that a melt pool is formed on top of each source of ceramic material from which ceramic material is vaporized, at least a portion of the vapors from the plurality of sources of ceramic material being deposited on the workpiece to form a coating;

maintaining the vaporization of the plurality of sources of ceramic material until a predetermined thickness of coating is formed on the surface of the workpiece, the predetermined thickness of applied coating being reduced by at least 10% from the predetermined thickness of coating applied at a position substantially over the material source.

7. The method of claim 6 wherein the physical vapor deposition apparatus is an electron beam-physical vapor deposition apparatus and the at least one high energy source is at least one electron gum positioned within the vacuum chamber.

8. The method of claim 7 wherein the workpiece is an airfoil.

9. The method of claim 8 wherein the plurality of sources of ceramic material are yttria-stabilized zircona.

10. The method of claim 9 wherein the yttria-stabilized zirconia is 7YSZ.

11. The method of claim 10 wherein the reduction in coating density between the airfoil positioned at the preselected distance from the plurality of sources of ceramic material and an airfoil positioned substantially over a source of ceramic material is at least about 2% based on the maximum theoretical density of 7YSZ.

12. The method of claim 6 further comprising the step of positioning each source of ceramic material of the plurality of sources of ceramic material a predetermined distance from each other source of ceramic material to obtain the preselected distance of the workpiece in the vacuum chamber from the plurality of sources of ceramic material.

13. The method of claim 12 wherein the predetermined distance from each source of ceramic material is a distance where the predetermined thickness of applied coating on the workpiece is about 60% of the predetermined thickness of a coating applied at a position substantially over a source of ceramic material.

* * * * *

UNITED STATES PATENT AND TRADEMARK OFFICE
CERTIFICATE OF CORRECTION

PATENT NO. : 6,620,465 B2
DATED : September 16, 2003
INVENTOR(S) : Joseph D. Rigney and David J. Wortman It is certified that error appears in the above-identified patent and that said Letters Patent is hereby corrected as shown below:

Column 6,
Line 34, "a the distance" should read -- as the distance --.

Column 9,
Line 56, "preseleted" should read -- preselected --.

Signed and Sealed this

Twentieth Day of April, 2004

JON W. DUDAS
*Acting Director of the United States Patent and Trademark Office*